US012742237B2

(12) United States Patent
Shen et al.

(10) Patent No.: US 12,742,237 B2
(45) Date of Patent: Sep. 22, 2026

(54) STRUCTURES AND METHODS FOR PROCESSING A SEMICONDUCTOR SUBSTRATE

(71) Applicant: Taiwan Semiconductor Manufacturing Co., Ltd., Hsinchu (TW)

(72) Inventors: Ming-Yi Shen, Hsinchu (TW); Hsin-Lin Wu, Hsinchu (TW); Yao-Fong Dai, Hsinchu (TW); Pei-Yuan Tai, Hsinchu (TW); Chin-Wei Chen, Hsinchu (TW); Yin-Tun Chou, Hsinchu (TW); Yuan-Hsin Chi, Hsinchu (TW); Sheng-Yuan Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 178 days.

(21) Appl. No.: 18/446,392

(22) Filed: Aug. 8, 2023

(65) Prior Publication Data

US 2023/0383399 A1 Nov. 30, 2023

Related U.S. Application Data

(62) Division of application No. 17/187,410, filed on Feb. 26, 2021, now Pat. No. 12,286,706.

(51) Int. Cl.

*C23C 14/56* (2006.01)
*C23C 14/50* (2006.01)
*C23C 16/455* (2006.01)
*C23C 16/458* (2006.01)
*H10P 72/76* (2026.01)

(52) U.S. Cl.

CPC ............ *C23C 14/564* (2013.01); *C23C 14/50* (2013.01); *C23C 16/455* (2013.01); *C23C 16/45521* (2013.01); *C23C 16/4585* (2013.01); *H10P 72/7611* (2026.01); *H10P 72/7621* (2026.01)

(58) Field of Classification Search

CPC .................................................. C23C 16/4585
See application file for complete search history.

(56) References Cited

U.S. PATENT DOCUMENTS 5,304,248 A 4/1994 Cheng et al.
5,769,951 A 6/1998 van de Ven et al.
5,882,417 A 3/1999 van de Ven et al.
6,033,480 A * 3/2000 Chen .................. C23C 16/4583 118/715
6,319,553 B1 11/2001 McInerney et al.
8,753,447 B2 6/2014 Lind et al.

(Continued)

*Primary Examiner* — Alex A Rolland
(74) *Attorney, Agent, or Firm* — Seed IP Law Group

(57) ABSTRACT

The present disclosure relates to exclusion rings for use in processing a semiconductor substrate in a processing chamber, such as a chemical vapor deposition chamber. The exclusion ring includes an alignment structure that cooperates with an alignment structure on a platen on which the exclusion ring will rest during processing of the wafer. The first alignment structure includes a guiding surface which promotes the reception of and positioning of the second alignment structure within the first alignment structure. Methods of utilizing the described exclusion rings are also described.

20 Claims, 11 Drawing Sheets

(56) References Cited

U.S. PATENT DOCUMENTS

| | | | | |
|---|---|---|---|---|
| 2005/0196971 | A1* | 9/2005 | Sen | C23C 16/4585 438/778 |
| 2009/0283036 | A1* | 11/2009 | Duong | C23C 16/4401 118/500 |
| 2010/0122655 | A1* | 5/2010 | Tiner | C23C 16/4585 118/504 |
| 2016/0060756 | A1 | 3/2016 | Park et al. | |
| 2019/0363003 | A1 | 11/2019 | Sarode Vishwanath | |

* cited by examiner

STRUCTURES AND METHODS FOR PROCESSING A SEMICONDUCTOR SUBSTRATE

BACKGROUND

Chemical vapor deposition ("CVD") is a gas reaction process commonly used in the semiconductor industry to form thin layers of material, known as films, over an integrated circuit substrate. The CVD process is based on the thermal, plasma, or thermal and plasma decomposition and reaction of selected gases. The most widely used CVD films are silicon dioxide, silicon nitride, and polysilicon, although a wide variety of CVD films suitable for insulators and dielectrics, semiconductors, conductors, superconductors, and magnetics are well known.

Particulate contamination of CVD films must be avoided. A particularly troublesome source of particulates in the chemical vapor deposition of metals and other conductors is the film that forms on the edge and backside of the wafer under certain conditions. For example, if the wafer edge and backside are unprotected or inadequately protected during deposition, a partial coating of the CVD material forms on the wafer edge and backside, respectively. This partial coating tends to peel and flake easily for some types of materials, introducing particulates into the chamber during deposition and subsequent handling steps.

In atomic layer deposition (ALD), a film is deposited layer by layer by successive dosing and activation steps. ALD is used to generate conformal films on high aspect ratio structures. In some ALD processes, film deposition on the backside of the wafer is difficult to avoid because the film can be deposited through any gap accessing the wafer backside. Backside deposition is unwanted for a number of reasons, one of which is that excess film on the backside of the wafer is susceptible to flaking, e.g., during wafer transport. If flakes from the backside of the wafer come into contact with a wafer (either the same wafer or a different wafer), the wafer becomes contaminated and defects can result.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
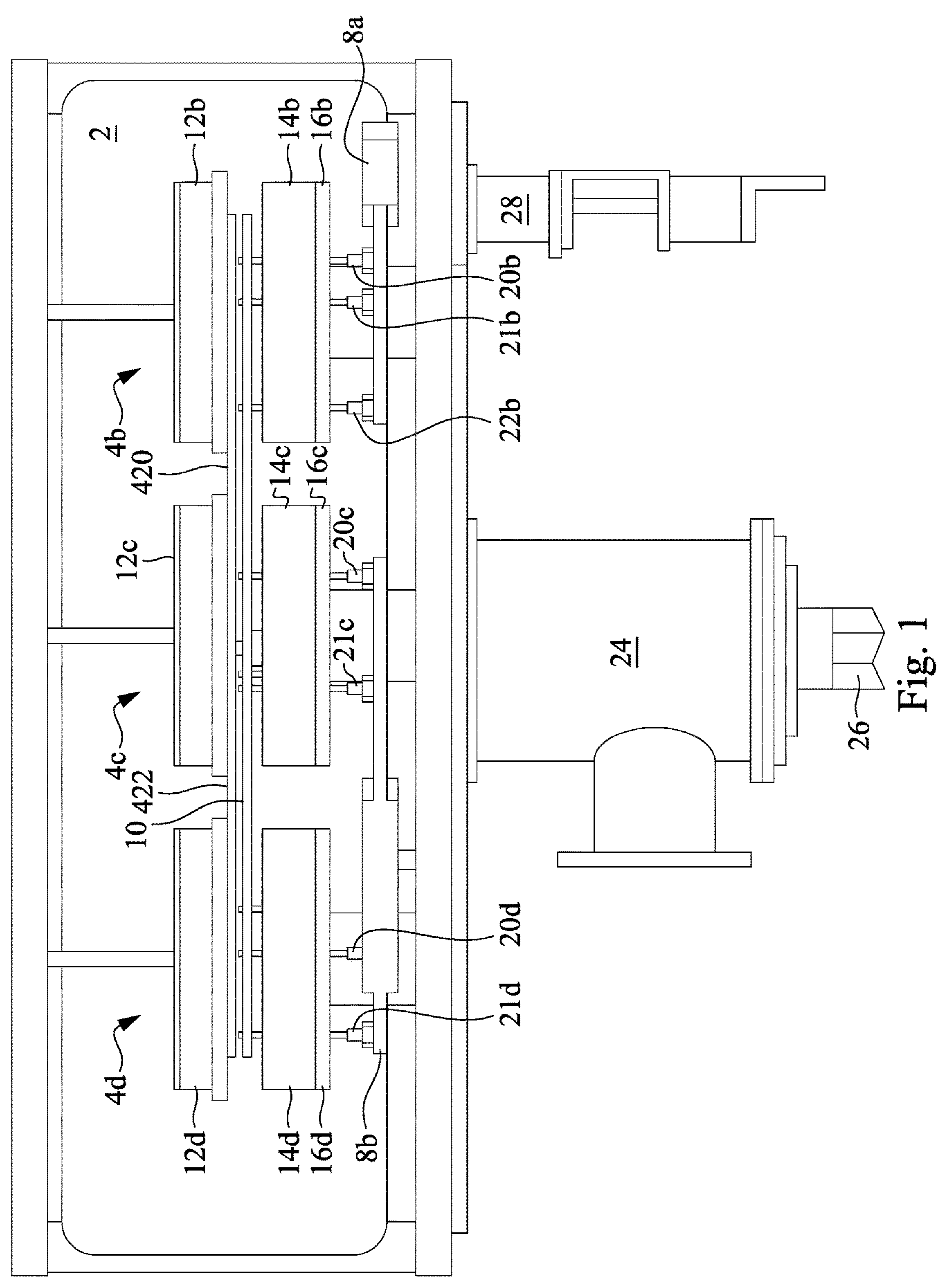
FIG. 1 is a cross-sectional view of a process chamber for carrying out a process on a substrate in accordance with embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A "substrate" as referred to herein, includes, but is not limited to, semiconductor wafers, semiconductor workpieces, and other workpieces such as optical planks, memory disks, and the like. Embodiments of the invention may be applied to any generally flat workpiece on which material is deposited by the methods described herein and utilizing the devices described herein.

"Vertical direction" and "horizontal direction" are to be understood as indicating relative directions. Thus, the horizontal direction is to be understood as substantially perpendicular to the vertical direction and vice versa. Nevertheless, it is within the scope of the present disclosure that the described embodiments and aspects may be rotated in its entirety such that the dimension referred to as the vertical direction is oriented horizontally and, at the same time, the dimension referred to as the horizontal direction is oriented vertically.

One embodiment described herein is directed to an exclusion ring that includes a first alignment structure on its underside. This first alignment structure cooperates with a second alignment structure on an upper surface of a platen upon which the exclusion ring will be placed. The cooperation between the first alignment structure and the second alignment structure promotes proper alignment of the exclusion ring with a wafer supported by the platen. The first alignment structure includes guiding surfaces which increases the likelihood that the first alignment structure will receive and mate with the second alignment structure. Proper alignment and mating of the second alignment structure with the first alignment structure promotes alignment of the exclusion ring with the wafer to within process tolerances.

Generally, excited species of processing gases may be generated to assist an atomic layer deposition (ALD) process as described herein. These species may be excited by plasma assistance, UV assistance (photo assistance), ion assistance (e.g., ions generated by an ion source), or combinations thereof. The species are excited in, or in the vicinity of, the process region within the processing chamber housing to avoid relaxation of the excited states before the ions reach the process region of the batch processing chamber. An embodiment of the present disclosure is described in the context of a CVD process carried out without a plasma enhancement; however, the present disclosure is not limited to an embodiment that carries out a CVD process without a plasma enhancement. Embodiments of the present disclosure include other material deposition processes that are carried out utilizing CVD with plasma enhancement.

In FIG. 1, wafer process stations 4*b*, 4*c*, and 4*d* are visible in a side view of a high pressure CVD reaction chamber. Process stations 4*b*-4*d* are not drawn to scale so that other features may be more readily apparent. Process station 4*c*, for example, includes a dispersion head 12*c* for introducing a process gas or gas mixture over a wafer to be processed; a platen 14*c* for supporting the wafer to be processed; a pedestal base 16*c*, which includes a heater for heating platen 14*c* and indirectly supplying heat to the wafer to be processed; and pin lift platform 8*b*, which is associated with pins 20*c*, 21*c* and another pin not shown for lifting and lowering the wafer to be processed in coordination with activation of a wafer transport mechanism 10. Similarly, process station 4*b* includes gas dispersion head 12*b*, platen 14*b*, pedestal base 16*b*, and pin lift platform 8*a* in association with pins 20*b*, 21*b* and 22*b*. Similarly, process station 4*d* includes gas dispersion head 12*d*, platen 14*d*, pedestal base 16*d*, and pin lift platform 8*b* in association with pins 20*d*, 21*d* and another pin (not shown). Also shown in FIG. 1 are a vacuum exhaust port 24, a spindle lift/rotation mechanism 26, and a pin lift mechanism 28. Another two process stations are invisible in the side view of the high pressure CVD reaction chamber which are similar to process stations 4*b*-4*d*.

The exclusion guard lift assembly 420 is mounted within process chamber 2 as shown in FIG. 1. The exclusion guard lift assembly 420 is coupled for vertical movement with a rotatable wafer transport mechanism (not shown), while allowing the exclusion guard lift mechanism to be rotationally static relative to the process stations 4*a*-4*e* during rotation of the wafer transport mechanism.

The wafer to be processed is introduced into the process chamber 2 from the load lock chamber and is received at an empty load/unload station and lowered onto raised lift pins of the empty load/unload station. By coordinating the rotation of wafer transport mechanism and the raising and lowering of the lift pins, the wafers are transported to successive ones of the stations 4*b*-4*d*. As the wafer transport mechanism rises toward a level suitable for engaging wafers at the stations 4*b*-4*d*, the exclusion guard lift plate 422 also rises, thereby lifting exclusion guards to clear the space above the process stations 4*b*-4*d* for transport of the wafers. As the wafer transport mechanism lowers from the level suitable for engaging wafers at the stations 4*b*-4*d*, the exclusion guard lift assembly 420 also lowers which consequently lowers the lifted exclusion guards. Note that the motion of lift pins follows the upward motion movement of transport mechanism and exclusion guard lift assembly 420, and precedes the downward movement of transport mechanism and exclusion guard lift assembly 420.

When the lift pins at the stations 4*b*-4*d* lower, the wafers to be processed are deposited on respective platens 14*b*-14*d* under respective gas dispersion heads 12*b*-12*d*. Once the wafers are deposited on the respective platens 14*b*-14*d*, the wafers are preferably secured to the respective platens 14*b*-14*d*. Various techniques for securing the wafers to a wafer contact on a respective platen may be used. One preferable technique uses a vacuum chuck or electrostatic chuck.

When the exclusion guard lift assembly 420 is lowered, exclusion guards are deposited on the top of the platens 14*b*-14*d* at the respective process stations 4*b*-4*d*, thereby exclusion guarding the wafers. Various measures may be taken to retain the exclusion guards in place, for example the exclusion guards may be made to be of a suitable weight so that gravity acts to retain the exclusion guards in place. The exclusion guards may also be provided with a form of a keeper to help reversibly secure the exclusion guard to other components of the respective stations 4*b*-4*d*.

In order to stimulate the deposition of material onto the wafer being processed, heat is provided to the wafer. One method of providing heat to the wafer involves heating each of the respective platens 14*b*-14*d* which transfers heat to the wafers sitting respectively thereon.

In some deposition operations, and particularly in the CVD deposition of metals and metal compounds such as tungsten, titanium nitride, and silicides, one may wish to exclude deposition of material from the wafer backside and from the wafer edge. Excluding the deposition of material on the wafer backside and/or the wafer edge involves introducing a deposition control gas near an edge of a wafer positioned on a platen from within each of the respective platens 14*b*-14*d*. The term "deposition control" gas means a gas that assists in controlling or eliminating chemical vapor deposition of material on certain portions of the wafer. For example, in one embodiment the deposition control gas contains chemicals, such as argon, that enhance deposition near areas of a wafer such as the front side peripheral region of a wafer exposed to a mixture of the deposition control gas and process gas, while excluding process gas from other portions such as the wafer backside and the wafer edge to prevent unwanted deposition thereon. Since the edge of a wafer may have multiple planar and non-planar, beveled and non-beveled edge surfaces, the term "edge" is intended to encompass all non-front side, non-backside surfaces. In accordance with embodiments of the present disclosure, the deposition gas is delivered to the platens 14*b*-14*d* and made available for dispersion into the process chamber as described below in more detail.

A variety of materials may be deposited using various process gases with suitably selected deposition control gases. For example, to deposit a tungsten film the product reactant $WF_6$ is used under the reactant conditions of $H_2$ and Ar. The $WF_6$ and $H_2$ gases are the reactant components of the process. A suitable deposition control gas is argon, hydrogen, or a mixture of argon and hydrogen.

Uniformity of deposition near the front side periphery of the wafers being processed is further improved by including a reactive component of the process gas in the deposition control gas. In the example of the preceding paragraph in which the reactant gases are $WF_6$ (product reactant) and $H_2$ and the carrier gas is Ar or $N_2$ or a mixture of Ar and $N_2$, improved uniformity of edge deposition is obtained by mixing the reactive component $H_2$ with Ar or $N_2$ or a mixture of Ar and $N_2$ to obtain the deposition control gas. The proper proportion of reactive component to inert gas is determined empirically. The process gas mixture (e.g., $WF_6$+$H_2$+Ar flow ratios and $WF_6$+$H_2$+Ar total flow) and deposition control gas mixture (e.g., $H_2$+Ar flow ratios and $H_2$+Ar total flow) are interactively combined and changed to produce the best front side wafer uniformity while maintaining process gas exclusion from the wafer edge and backside.

In depositing other films, other process gases with different reactant components may be used. Suitable inert gases for use in the deposition control gas mixture include argon, nitrogen, and helium or any suitable combination thereof. An inert gas is any gas that does not react adversely with the materials present in the process chamber and in the gas distribution system, and that does not participate in the chemical reactions involved. Moreover, it is desirable that the thermal conductivity and heat capacity of the inert gas be sufficient to achieve good temperature uniformity across the wafers being processed. Embodiments of the present disclosure are not limited to the gases described above. Embodiments in accordance with the present disclosure utilize other reactant gases and carrier gases.

Exclusion of process gas from the wafer backside and edge is assisted by the use of a structure such as the "exclusion guard" or minimum overlap exclusion ring ("MOER") in combination with the use of the deposition control gas during processing. A generalized embodiment of an exclusion guard, which is made of any suitable material such as metal or ceramic (including, for example, alumina), is exclusion guard 1000 shown in FIG. 2. Exclusion guard 1000 includes an annular body 200. The annular body 200 includes an outer peripheral edge 201, an inner peripheral edge 203, an upper surface 207 and a lower surface 209. An open or void central region 205 is located radially inward from the inner peripheral edge 203. A flange 404 in FIG. 3 extends from the lower surface 209 adjacent to the outer peripheral edge 201. The exclusion guard of FIG. 2 includes an alignment hole 1004 on the underside of flange 404 and an alignment slot 1006 on the underside of flange 404. In other embodiments the exclusion guard includes one or the other of an alignment hole 1004 and an alignment slot 1006. In other embodiments, the exclusion guard or ring includes more than one alignment hole 1004 or more than one alignment slot 1006. Further details of the alignment hole 1004 and alignment slot 1006 are provided below.

Figure 3:
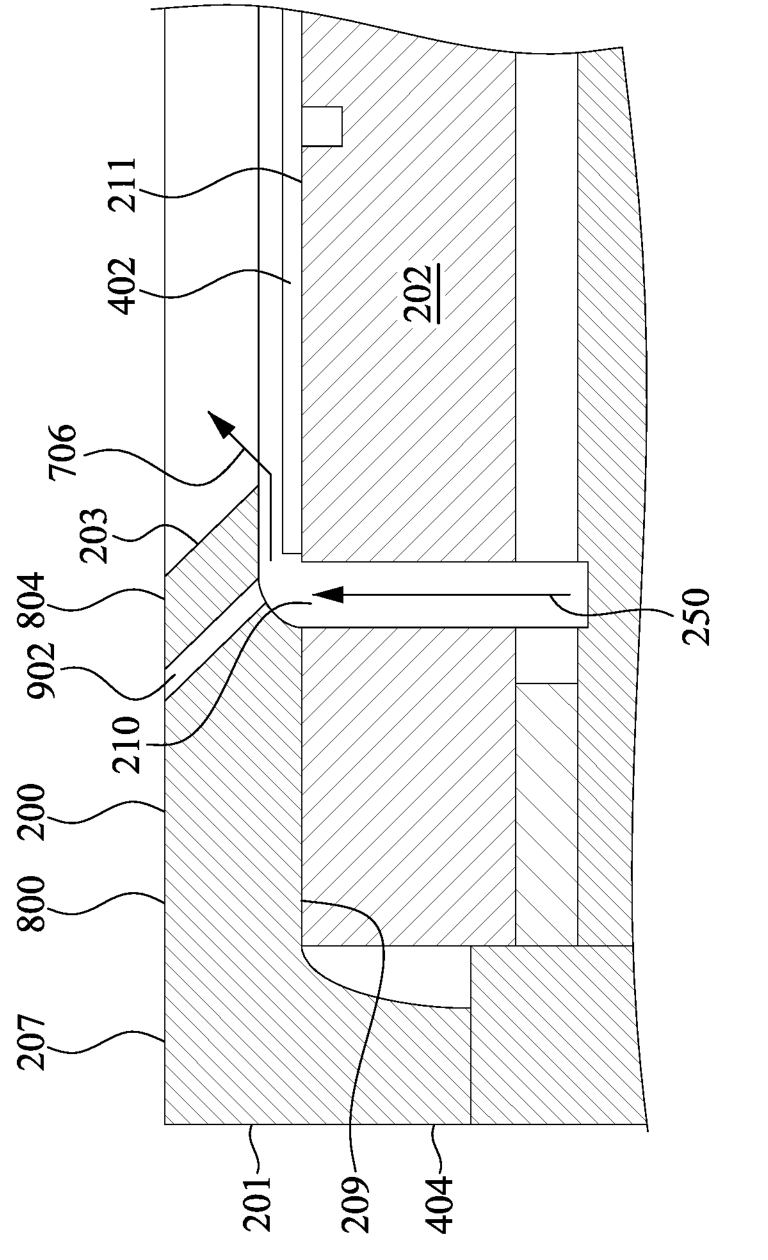
FIG. 3 is a schematic enlarged view of an exclusion ring on a platen in accordance with an embodiment of the present disclosure.

FIG. 3 illustrates an exploded partial cross sectional view of an exclusion guard 800 residing on platen 202. The exclusion guard includes a peripheral downward extending flange 404. During processing, deposition control gas is introduced into platens 14*b*-14*d* for dispersion into the process chamber as discussed above. Restrictive opening 706 serves to equalize the pressure in a plenum formed in part by gas groove 210 and the cavity between gas groove 210 and extension 804. As a result deposition control gas flow, as indicated by the arrows on FIG. 3 is uniform through the restrictive opening 706 over the entire wafer front side periphery. This uniform deposition control gas flow denies or reduces process gas access to the edge and backside of the wafer 402, thereby preventing or reducing material deposition on these surfaces.

To improve the extent of uniform material deposition on the wafer 402 front side periphery, the deposition control gas preferably includes one or more reactive components of the process gas as discussed above. The reactive component in the deposition control gas enhances deposition at the wafer 402 periphery to compensate for any process gas flow interference in a region caused by the deposition control gas venting from restrictive opening 706 and the physical presence of a portion of the extension 804 extending over the wafer 402 into the flow pattern of the process gas. For example, when depositing W and using $H_2$ as the reactive component in the deposition control gas, the deposition rate of W (produced by reacting $WF_6$ with $H_2$) varies proportionately with the square root of the $H_2$ concentration, i.e., a four times increase in the quantity of $H_2$ increases the deposition rate of W by a factor of two. Therefore, to enhance the deposition of W by a factor of two at the front side periphery of a wafer, the $H_2$ concentration is increased by a factor of four at the front side periphery of the wafer. Note that a greater overall concentration of $H_2$ may be required in the deposition control gas to assure that an increase of four times reaches the wafer front side periphery. Note also that when increasing a reactive component in the deposition control gas, for example Hz, a reactive component in the process gas, for example $WF_6$, is preferably supplied to sustain the kinetically possible deposition rate. Otherwise, the reaction may be "starved" in regions rich in $H_2$ and deficient in $WF_6$.

The flow rate of the deposition control gas is inversely related to the quantity of reactive component present in the deposition control gas. Therefore, when the flow rate is reduced, the quantity of a reactive component (e.g., Hz) may be increased to achieve the desired uniformity of deposition on the frontside of wafer 402, and vice versa.

In some processes a reduced flow of deposition control gas may not deliver sufficient reactive component(s) to the interference region to overcome perturbation of the process gas flow by the exclusion guard 800 and the dilution effect of the deposition control gas venting from the restrictive opening 706, so that the extent of uniform deposition may not be as great as desired. Providing orifices in an exclusion guard minimizes deposition control gas interference while preferably increasing the supply of reactive components to the wafer 402 front side periphery. For example, the exclusion guard 1000 of FIG. 2 includes a plurality of orifices 1002. These holes are illustrated in FIG. 3 and identified by reference number 902. Holes 902 extend from the top surface of exclusion guard 800 to a deposition control gas source. The total amount of deposition control gas entering the process chamber equals the amount of deposition control gas flowing through restrictive opening 706 and holes 902. Therefore, the total amount of deposition control gas can be increased in the region of the process chamber over the wafer front side periphery without increasing the flow rate of deposition control gas through restrictive opening 706. The holes 902 should preferably vent a portion of the deposition control gas into the process chamber toward the outside edge of exclusion guard 800 to create a venturi effect to draw the process gas along the wafer front side toward the leading edge of the extension 804 during wafer processing, even while some of the deposition control gas diffuses back toward the leading edge of the extension 804 to increase the supply of reactant gas components to the front side periphery of wafer 402, thereby improving uniform wafer front side deposition.

Referring back to FIG. 2, a bottom view of an exclusion guard or exclusion ring 1000 having an array of orifices through which deposition control gas flows to promote a uniform deposition nearly out to the edge of the wafer being processed. The orifices or holes 920 are shown as solid circles. In the illustrated embodiment, there are 180 holes 920 spaced apart equally with the holes each having an equal diameter. Because of the extremely small width of the restrictive opening between the extension 804 and the front side of the mounted wafer, a large percentage of the deposition control gas vents through the holes 920. An alignment hole 1004 and alignment slot 1006 are also shown on the underside of the exclusion ring 1000. Alignment hole 1004 and alignment slot 1006 are located in flange 404. The outside edge of exclusion guard 1000 has indentations 1008 and 1010 to accommodate adjacent exclusion guards in process chamber 2 of FIG. 1.

As described above with reference to FIG. 3, exclusion ring 800 residing on platen 202 includes an extension 804 that overlaps a peripheral portion of the upper surface or front side of wafer 402. The exclusion ring 800 also overlaps the peripheral edge 203 of wafer 402. Exclusion ring 800 also defines one boundary of the restrictive opening 706. The other boundary of the restrictive opening 706 is defined by the upper surface of wafer 402. Properly locating and aligning the exclusion ring 800 relative to the wafer 402 ensures that the desired portions of the peripheral portion of the upper surface of wafer 402 and peripheral edge of wafer 402 is overlapped by the exclusion ring 800. Such proper location of the exclusion ring 800 promotes flow of the deposition control gas through restrictive opening 706 and uniform flow over the entire wafer upper surface periphery. This uniform flow of deposition control gas promotes formation of deposited films on the central regions of the wafer 402 and near the periphery of wafer 402 that are uniform and within with product specifications. When the exclusion ring is not properly located and aligned with the wafer 402, portions of the upper surface of wafer 402 can be left uncovered or covered to a lesser degree than desired and other portions of the upper surface of wafer 402 can be covered to a greater degree than desired. Both of these situations can result in deposited materials that do not exhibit uniform properties, e.g., thickness.

Figure 2:
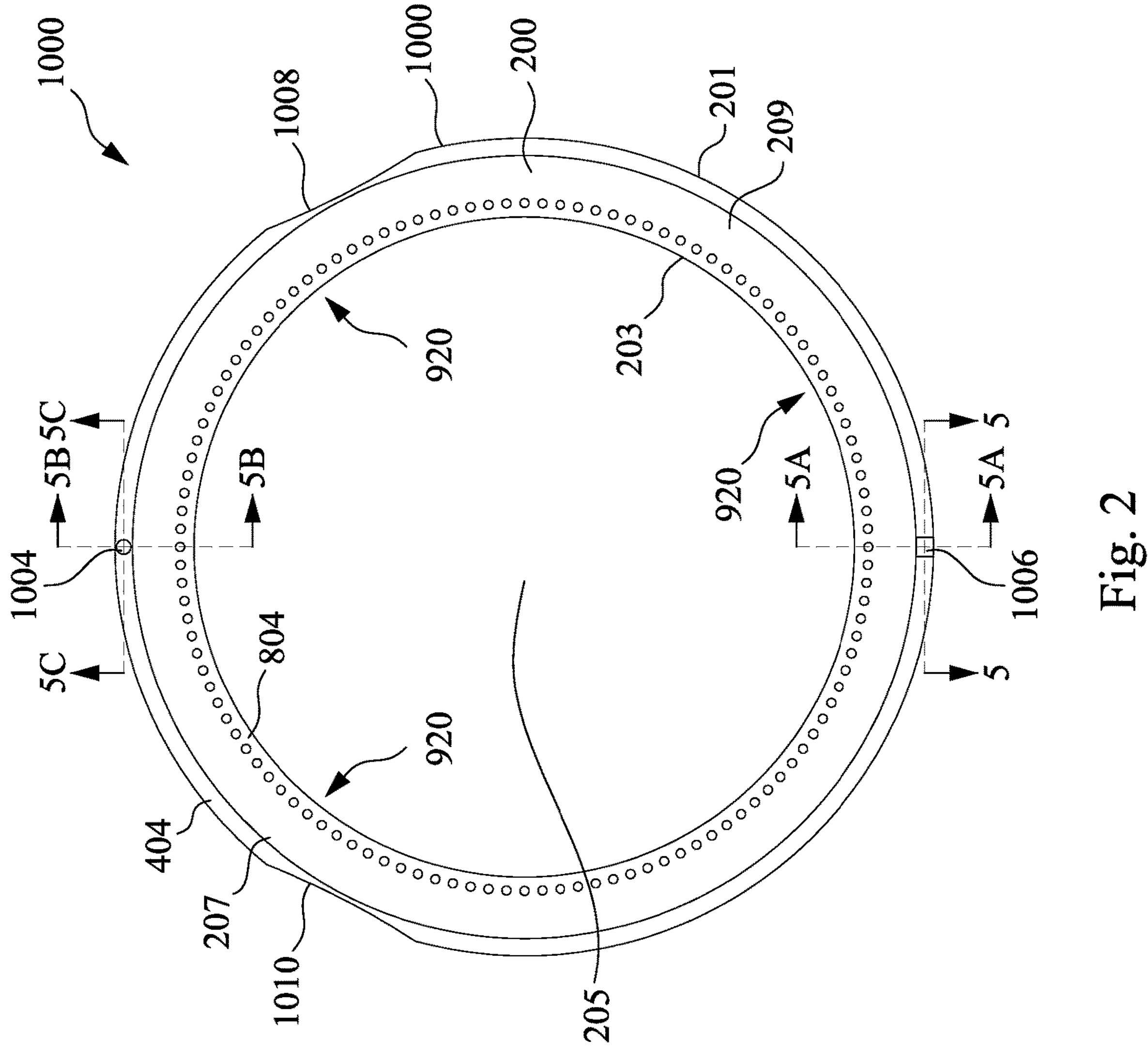
FIG. 2 is a bottom view of an exclusion ring in accordance with an embodiment of the present disclosure.
Figure 4:
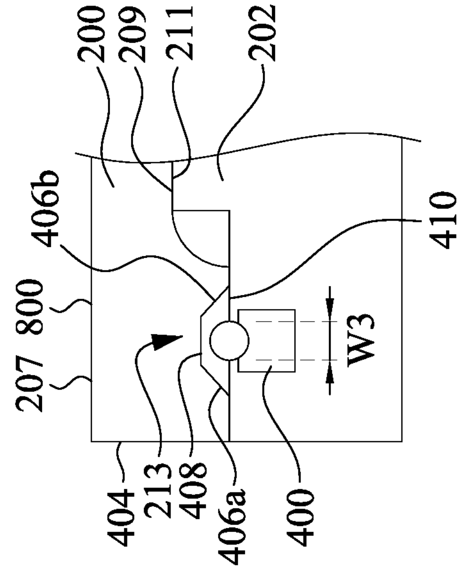
FIG. 4 is a schematic enlarged view of a first alignment structure on an exclusion ring and a second alignment structure on a platen in accordance with an embodiment of the present disclosure.
Figure 5:
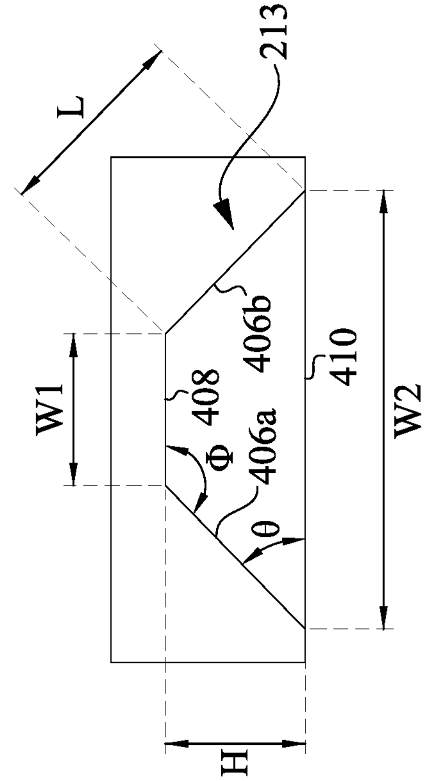
FIG. 5 is a cross-sectional view of a first alignment structure in accordance with an embodiment of the present disclosure.

Referring to FIGS. 4 and 5, an embodiment of an alignment structure 213, e.g., alignment slot 1006 in FIG. 2, has a shape of an isosceles trapezoid formed within the underside of exclusion ring 1000, and more specifically, in the underside of flange 404. The isosceles trapezoid shape of alignment structure 213 is characterized by a line of symmetry bisecting one pair of opposite sides. In FIGS. 4 and 5, the opposite sides are a top side 408 and a bottom side 410. Alignment structure 213 is further characterized by a diagonal surface forming a guiding surface 406*a* and diagonal surface forming a guiding surface 406*b* that are equal in length and each form an equal angle with bottom side 410 and equal angle with top side 408.

In FIG. 4, a second alignment structure 400 includes an alignment pin that is present on an upper surface 211 of platen 202. In the illustrated embodiment of the second alignment structure 400 in FIG. 4, a lower portion of the alignment pin is embedded in an upper surface 211 of platen 202. An upper portion of the second alignment structure extends above the upper surface 211 of platen 202 by a distance H1. In the embodiment of FIG. 4, the upper portion of the second alignment structure that extends above the upper surface 211 of platen 202 has a round shape, e.g., is ball shaped. This ball-shaped upper portion has a diameter of W3. In other embodiments in accordance with the present disclosure, the upper portion of the second alignment structure 400 is not round shaped. For example, the upper portion of the second alignment structure 400 can have a square or rectangular cube shape, e.g., the shape of an isosceles trapezoid. In some embodiments, the shape of the upper portion of the second alignment structure 400 is substantially congruent with the shape of the first alignment structure 213. In other embodiments, the second alignment structure 400 is comprised of only the upper portion that extends above the upper surface of platen 202 and does not include the lower portion that is contained within the body of platen 202. When the second alignment structure includes only the upper portion that extends above the upper surface of platen 202, the upper portion is secured to the upper surface 211 of platen 202. In accordance with embodiments described herein, when second alignment structure 400 is properly seated within first alignment structure 213, exclusion ring 800 located in a desirable position and is aligned with wafer 402 such that deposition control gas flow from the restrictive opening 706 between wafer 402 and exclusion ring 800 is uniform and flows over the entire wafer front side periphery. Such uniform flow of the deposition control gas promotes uniform material deposition near the wafer front side periphery and reduces or prevents non-uniform wafer deposition near the wafer front side periphery.

FIG. 5 shows a cross section of first alignment structure 213 and a portion of flange 404 in which first alignment structure 213 is located. The cross section in FIG. 5 is taken along line 5-5 in FIG. 2. The cross section of alignment structure 213 along line 5A-5A in FIG. 2 is identical to the cross section of first alignment structure 213 along line 5-5 in FIG. 2.

Referring to FIG. 5 first alignment structure 213 includes a topside 408 having a length W1. Opposite to top side 408, first alignment structure 213 includes bottom side 410 having a length W2. Bottom side 410 is parallel to top side 408. In some embodiments, topside 408 is parallel to upper surface 207 of annular body 200 of exclusion ring 800. In the illustrated embodiment, W2 is greater than W1. The distance between topside 408 and bottom side 410 is height H. First alignment structure 213 also includes guiding surfaces 406*a* and 406*b* formed by opposing legs or diagonal sides of the isosceles trapezoid shape of alignment structure 213. In the illustrated embodiment, these diagonal sides each have a length L. Embodiments of the present disclosure are not limited to diagonal sides that are of equal length. For example, in other embodiments, the length of one diagonal side forming guiding surface 406*a* is less than or greater than the length of the diagonal side forming guiding surface 406*b*. In embodiments where the length of one diagonal side is unequal to the length of the other diagonal side, the parallel relationship of topside 408 and bottom side 410 can be maintained by adjusting the slant or slope of either diagonal side forming guiding surfaces 406*a* or 406*b*.

The first alignment structure 213 is further characterized by an angle theta (Θ), formed between bottom side 410 and the diagonal side forming guiding surface 406*a*, that has an arc sine equal to H/L. When bottom side 410 is parallel to lower surface 209 of annular body 200, the diagonal side forming guiding surface 406*a* slopes at an angle Θ relative to the lower surface 209 of annular body 200. When the diagonal side forming guiding surface 406*a* and the diagonal side forming guiding surface 406*b* are equal in length, the diagonal side forming guiding surface 406*b* also forms an angle Θ with bottom side 410 and has an arc sine equal to H/L. When bottom side 410 is parallel to lower surface 209 of annular body 200, the diagonal side forming guiding surface 406*b* slopes at an angle Θ relative to the lower surface 209 of annular body 200. The diagonal side forming guiding surface 406*a* forms an angle psi (ϕ) with the top side 408 of first alignment structure 213. Angle ϕ is characterized by an arc cosine that is equal to H/L. Similarly, the diagonal side forming guiding surface 406*b* forms and an angle psi (ϕ) with the top side 408 of first alignment structure 213 that has an arc cosine equal to H/L. When the top side 408 is parallel to upper surface 207 of annular body 200 of exclusion ring 800, the diagonal side forming guiding surface 406*a* slopes at an angle ϕ relative to upper surface 207. When the top side 408 is parallel to upper surface 207 of annular body 200 of exclusion ring 800, the diagonal side forming guiding surface 406*b* slopes at an angle ϕ relative to upper surface 207.

In some embodiments, the angle ϕ is greater than 90°. For example, the angle ϕ is greater than 100°, greater than 110°, greater than 120°, greater than 130° or greater than 140°. In some embodiments, the sum of angle Θ and angle ϕ is 180°. In some embodiments angle Θ is less than 90°. For example, in some embodiments the angle Θ is less than 80°, is less than 70°, is less than 60° or is less than 50°.

In accordance embodiments of the present disclosure, W2 is greater than W1. For example, the ratio of W2 to W1 is between about 1.1 to about 2.0. In other embodiments, the ratio of W2 to W1 is between about 1.25 to about 1.75. In other embodiments, the ratio of W2 to W1 is between about 1.5 to about 1.65.

In accordance with embodiments of the present disclosure, the ratio of W1 to H is between 0.5 to 2.0. In accordance with other embodiments, the ratio of W1 to H is between about 1.0 and 1.5. In accordance with other embodiments, the ratio of W1 to H is between about 1.1 and 1.4. In accordance with other embodiments, the ratio of W1 to H is between about 1.2 and 1.3.

In accordance with embodiments of the present disclosure, the ratio of W2 to H is between about 1 to about 3. In accordance with other embodiments, the ratio of W2 to H is between about 1.5 and 2.5.

In accordance with embodiments of the present disclosure, the diameter or width W3 of the upper portion of second alignment structure 400 is at least 80% of the dimension W1. In other embodiments, W3 is at least 85% of the dimension W1. In other embodiments, W3 is at least 90% of the dimension W1. In other embodiments, W3 is at least 95% of the dimension of W1. A second alignment structure 400 having a dimension W3 within the ranges described above fits within the first alignment structure 213 with tolerances that result in the exclusion ring 800 being aligned with the wafer within process tolerances. The foregoing dimensions and ratios of dimensions for the first alignment structure 213 are selected to optimize the likelihood that the second alignment structure 400 will be received by the first alignment structure 213 and that the second alignment structure 400 will become properly seated within the first alignment structure 213 and therefore properly aligned over the wafer surface.

In accordance with embodiments of the present disclosure, the upper portion of the second alignment structure 400 extends above the upper surface 209 of platen 202 by a distance H1. In some embodiments, H1 is at least 80% of the dimension H. In other embodiments, H1 is at least 85% of the dimension H. In other embodiments, H1 is at least 90% of dimension H. In other embodiments, H1 is at least 95% of dimension H.

Figure 9B:
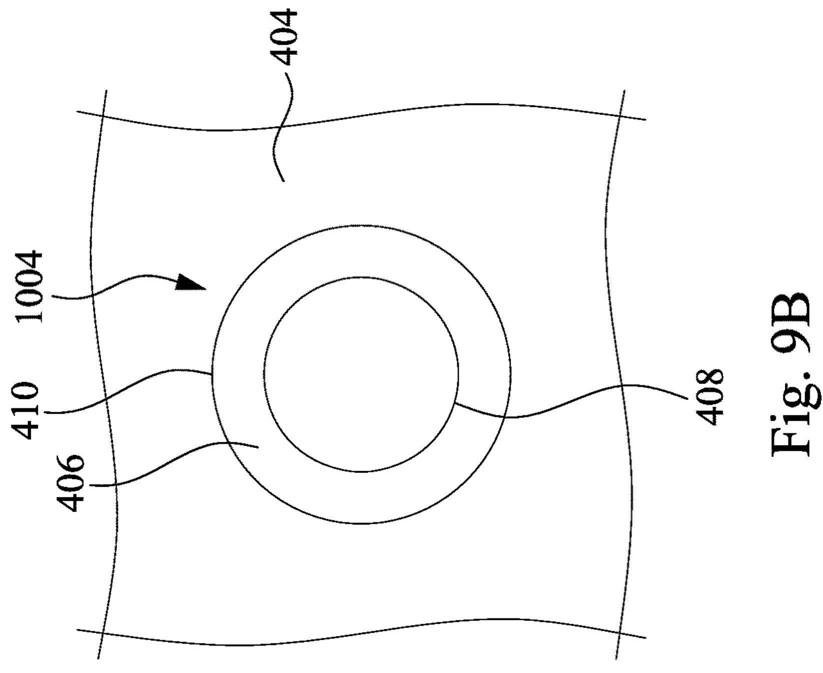
FIGS. 9A and 9B are plan views of two first alignment structures on a bottom surface of an exclusion ring in accordance with several embodiments of the present disclosure.
Figure 9A:
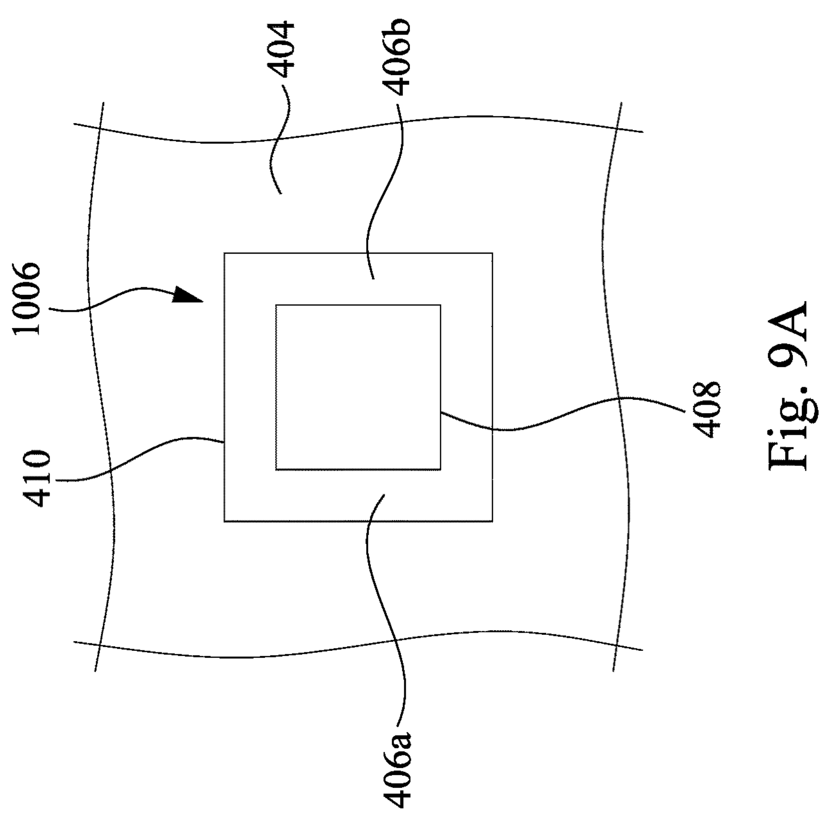

Referring to FIGS. 9A and 9B, bottom views of two embodiments of a first alignment structure 213 in flange 404 are provided. FIG. 9A is a view of a first alignment structure 213 in the form of an alignment slot 1006 formed in the underside of flange 404 of exclusion ring 1000 in FIG. 2. The embodiment of a first alignment structure 213 in FIG. 9A is a rectangular shaped depression (e.g., square shaped depression) having at least two guiding surfaces 406*a* and 406*b* extending between topside 408 and bottom side 410 of first alignment structure 213. FIG. 9B is a view of an alternative first alignment structure 213 in the form of an alignment hole 1004. Alignment hole 1004 differs from alignment slot 1006 by being circular in shape when viewed from below. First alignment structure 213 in the form of alignment hole 1004 includes a guiding surface 406 that extends between topside 408 and bottom side 410. A cross section of alignment hole 1004 along line 5B-5B in FIG. 2 will have the same shape as the cross section of alignment slot 1006 illustrated in FIG. 5. The cross section of alignment hole 1004 along line 5C-5C in FIG. 2 will have the same cross section shape as the cross section taken along line 5B-5B in FIG. 2. In accordance with the present disclosure, first alignment structure 213 can have other shapes, provided such other shapes include the guiding surfaces of the first alignment structure 213 and mate with the second alignment structure 400 to position an exclusion ring so that it is aligned over wafer 402.

Figure 10B:
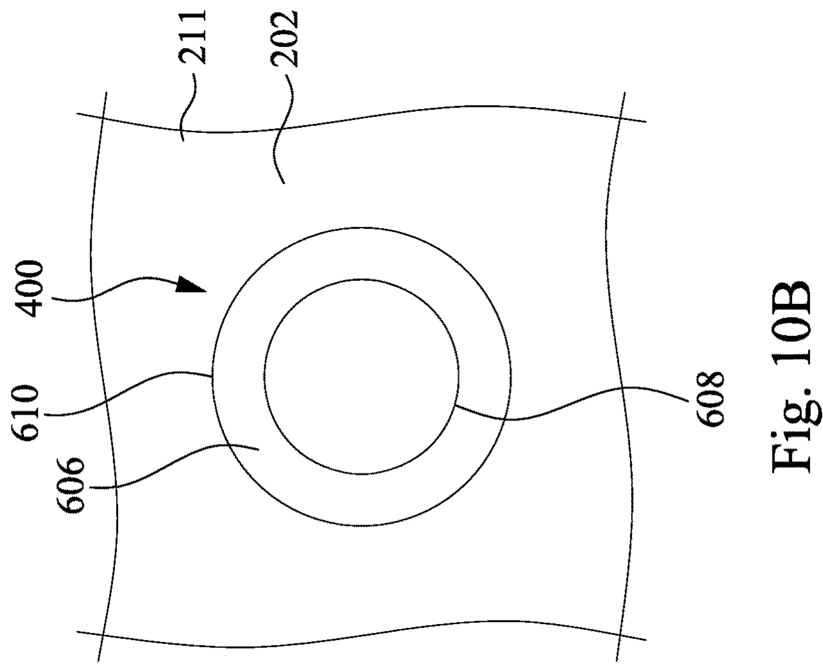
FIGS. 10A and 10B are plan views of two second alignment structures on an upper surface of a platen in accordance with several embodiments of the present disclosure.
Figure 10A:
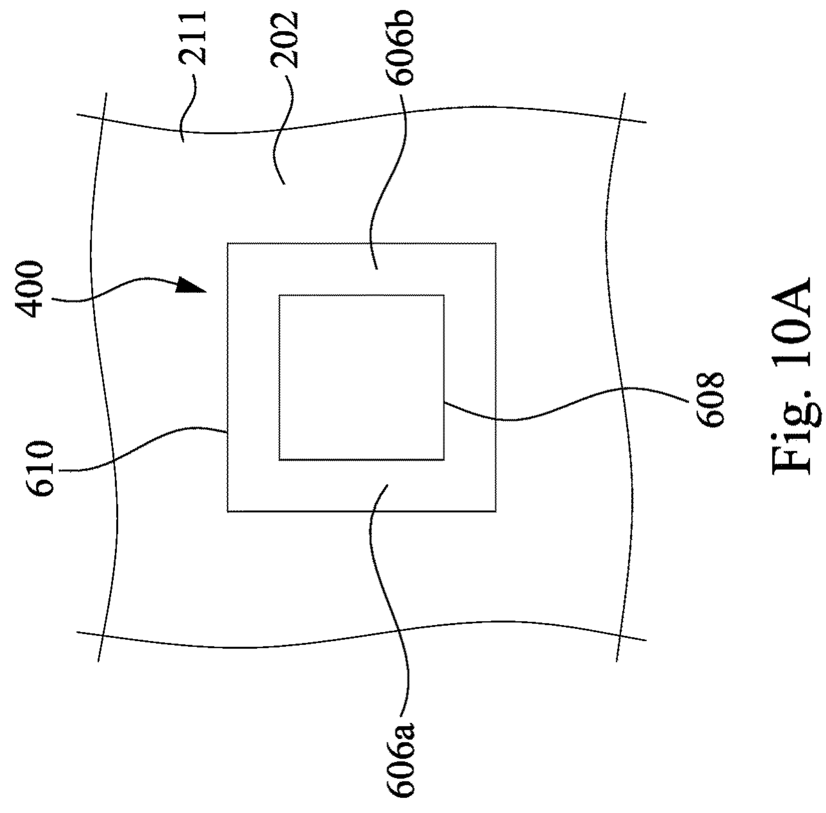
Figure 11:
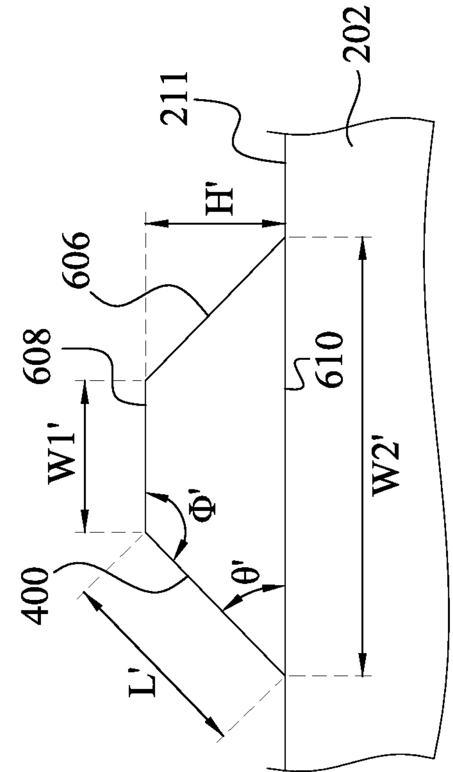
FIG. 11 is a cross-sectional view of a second alignment structure in accordance with several embodiments of the present disclosure.

Referring to FIGS. 10A and 10B, top views of two embodiments of a second alignment structure 400 on upper surface 211 of platen 202 are provided. FIG. 10A is a view of a second alignment structure 400 for mating with the alignment slot 1006 on the underside of flange 404 of exclusion ring 1000 in FIG. 2. This embodiment of a second alignment structure 400 in FIG. 10A is a rectangular shaped protrusion (e.g., square shaped protrusion) having at least two sloped surfaces 606*a* and 606*b* extending between top 608 and bottom 610 of second alignment structure 400. FIG. 10B is a view of an alternative second alignment structure 400 for mating with an alignment hole 1004. The second alignment structure 400 of FIG. 10B differs from the second alignment structure 400 of FIG. 10A by being circular in shape when viewed from above. The second alignment structure of FIG. 10A is similar to the second alignment structure of FIG. 4. Second alignment structure 400 in FIG. 10B includes a sloped surface 606 that extends between top 608 and bottom 610. A cross section of alignment structure 400 of FIGS. 10A and 10B is illustrated in FIG. 11. The second alignment structures 400 of FIGS. 10A and 10B can have a cross-sectional shape that is congruent with or substantially congruent with the cross-sectional shape of the first alignment structure 213 in FIG. 5. In FIG. 11 the dimensions of the second alignment structure 400 that are congruent with or are substantially congruent with the dimensions of the first alignment structure 213 are identified with the same alphabetical label and with a prime symbol added, i.e., L', H', W1', W2'. Second alignment structure 400 includes a topside 608, an opposing bottom side 610 which are substantially parallel to each other. Extending between topside 608 and bottom side 610 is at least one slanted or angled surface 606. The slanted or angled surface(s) 606 form angle Θ' and angle ϕ'. The descriptions above regarding dimensions L, H, W1 and W2 with regard to the FIG. 5 and first alignment structure 213 and the angles Θ and ϕ are equally applicable to dimensions L', H', W1', and W2' and to angles Θ' and ϕ' and are not reproduced here in the interest of brevity.

Figure 7:
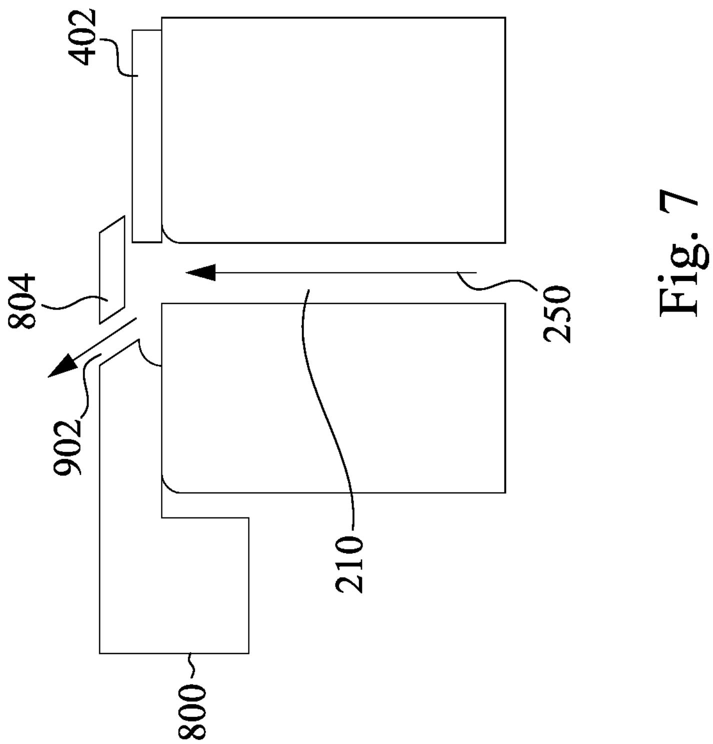
FIG. 7 schematic view of the flow of a deposition control gas in accordance with an embodiment of the present disclosure.

Referring to FIGS. 4 and 7, an exclusion ring 800 formed in accordance with embodiments of the present disclosure is utilized to promote alignment of the exclusion ring 800 with a wafer 402, the peripheral edges of which the exclusion ring is designed to cooperate with in order to ensure formation of films of material near the peripheral edges of the wafer that have uniform properties, e.g., thickness. FIG. 4 illustrates a side view of exclusion ring 800 properly seated on an upper surface 211 of platen 202. In FIG. 4, second alignment structure 400 is nested in first alignment structure 213. In the embodiment illustrated in FIG. 4, the width of first alignment structure 213 is greater than the width of the upper portion of second alignment structure 400 that extends into first alignment structure 213. The difference in the width between the upper portion of the second alignment structure and the width of the first alignment structure 213 is such that while exclusion ring 800 may shift from left to right in FIG. 4 and change the alignment of the exclusion ring 800 with wafer 402, the amount of such shifting is not so great that the alignment of the exclusion ring 800 with wafer 402 falls outside process tolerances. When exclusion ring 800 is properly seated on platen 202 and aligned with wafer 402, a portion of deposition control gases 250 from the platen flow through the orifices 902 in exclusion ring 800 as shown in FIG. 7. Another portion of the deposition control gases 250 flow between extension 804 and wafer 402 and across the upper surface of wafer 402. These flows of deposition control gases promotes formation of uniform films on the upper surface of wafer 402.

Figure 6:
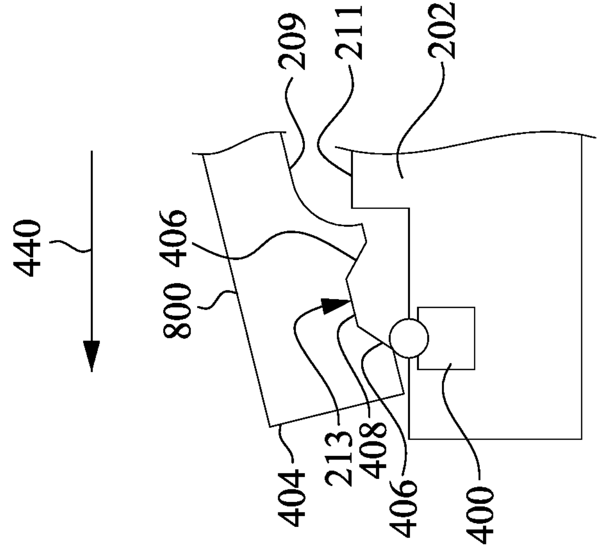
FIG. 6 is a schematic view of an exclusion ring being placed on a platen in accordance with an embodiment of the present disclosure.
Figure 8:
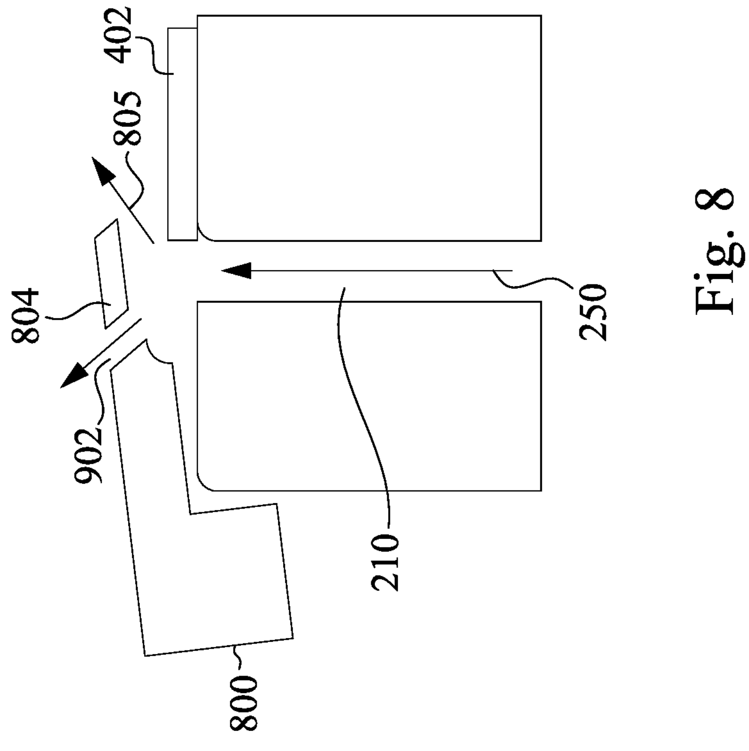
FIG. 8 is a schematic view of the flow of a deposition control gas.

FIG. 6 illustrates an embodiment illustrating how the first alignment structure 213 in accordance with embodiments of the present disclosure promote the proper alignment of exclusion ring 800 with wafer 402. In FIG. 6, exclusion ring 800 is placed in a position over platen 202 and is moving in the left hand direction as indicated by arrows 440. As illustrated, an upper portion of second alignment structure 400 formed in upper surface 211 of platen 202 contacts a lower surface 209 of exclusion ring 800. As the movement of exclusion ring 800 in the direction of arrow 440 continues, the upper portion of second alignment structure 400 begins to contact guide surface 406. Upper portion of second alignment structure 400 then cooperates with and slides along guide surface 406 until the second alignment structure 400 is centered within first alignment structure 213. Proper alignment of the upper portion of second alignment structure 400 within first alignment structure 406 is illustrated in FIG. 4. In FIG. 4, the upper portion of second alignment structure 400 is centered within the first alignment structure 213. If second alignment structure 400 were to be placed in the position illustrated in FIG. 6 with second alignment structure 400 not properly seated within first alignment structure 213 proper flow of deposition control gases is impeded. For example, referring to FIG. 8, if exclusion ring 800 is left in the position illustrated in FIG. 6, a larger portion of deposition control gases 250 will flow between extension 804 and the upper surface of wafer 402 as indicated by arrow 805 and less deposition control gases will flow through orifice 902. This alteration in the amount of deposition control gases directed to the two different flow pass can adversely affect the uniformity of films deposited during the vapor deposition process.

It should be appreciated that the greater degree the shape of the portion of the second alignment structure 400 that extends above the upper surface 211 of platen 202 is congruent with the shape of the first alignment structure 213, the less the exclusion ring 800 can shift and change the alignment with the wafer once the first alignment structure 213 and second alignment structure 400 are mated or nested together.

In accordance with other embodiments of the present disclosure, the location of the first alignment structure and the second alignment structure can be reversed. In other words, the first alignment structure can be formed on the platen and the second alignment structure can be formed on the exclusion ring. In one specific example of such an embodiment, the guide pin or protruding alignment structure is formed on the underside of the exclusion ring and the alignment slot or alignment hole or alignment depression for receiving the protruding alignment structure is formed on the upper surface of the platen.

Figure 12:
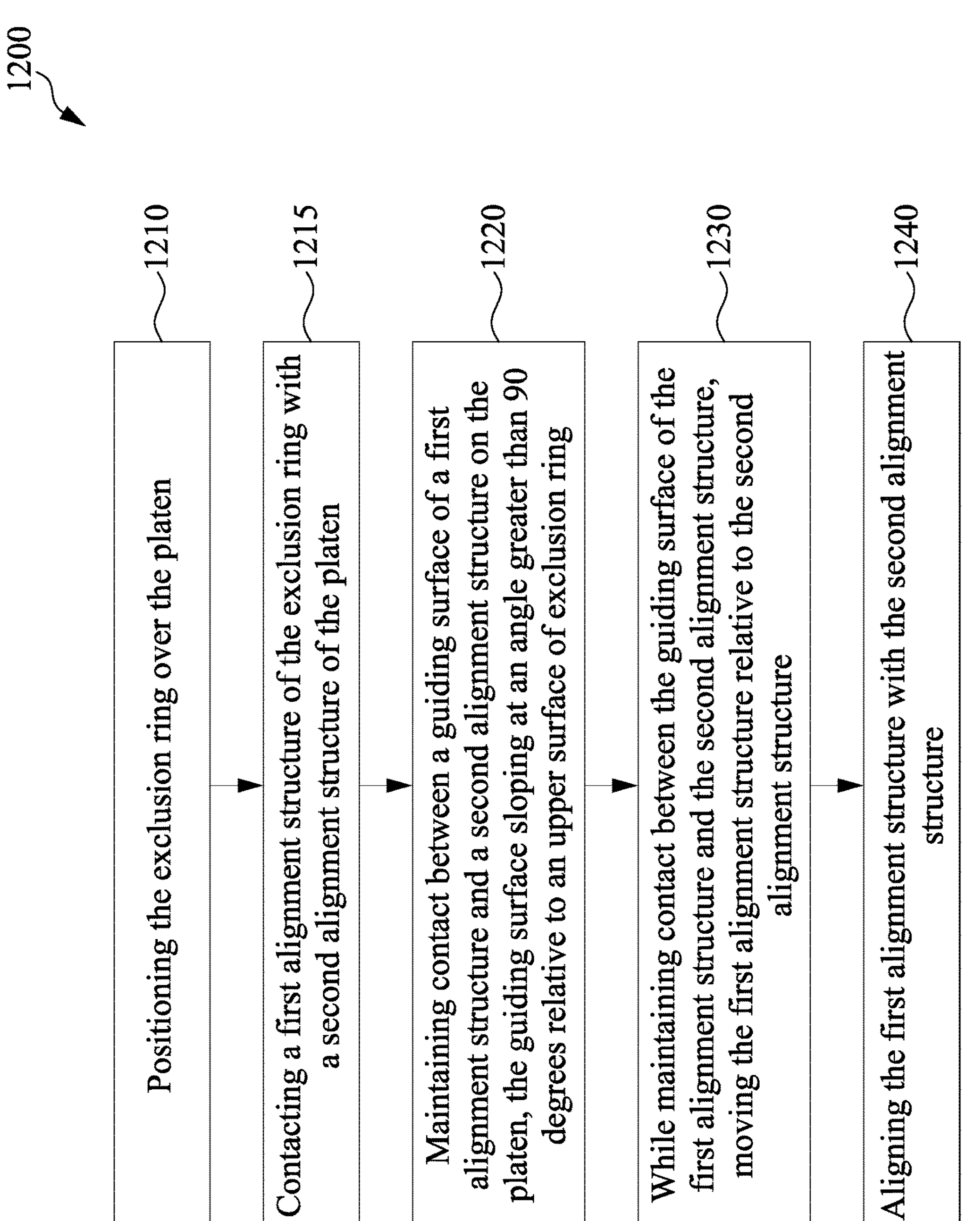
FIG. 12 is a flow chart of a method in accordance with an embodiment of the present disclosure.

FIG. 12 is a method for positioning an exclusion ring on a platen of a chemical vapor deposition tool according to one embodiment. At 1210, the method 1200 includes positioning an exclusion ring over a platen of a chemical vapor deposition tool. One example of an exclusion ring is the exclusion ring 1000 illustrated in FIG. 2 or the exclusion ring 800 in FIG. 3. At 1215, the method includes contacting a first alignment structure of the exclusion ring with a second alignment structure of the platen. At 1220, method 1200 includes maintaining contact between a guiding surface of a first alignment structure and a second alignment structure, the guiding surface slope being an angle greater than 90° relative to an upper surface of the exclusion ring. One example of a first alignment structure is the first alignment structure 213 illustrated and described in FIGS. 4 and 5. One example of a second alignment structure is the second alignment structure 400 illustrated and described in FIGS. 4, 10A, 10B and 11. At 1230, the method 1200 includes, while maintaining contact between the guiding surface of the first alignment structure and the second alignment structure, moving the first alignment structure relative to the second alignment structure. At 1240, method 1200 includes aligning the first alignment structure with the second alignment structure.

In one embodiment of the present disclosure, an exclusion ring for a chemical deposition tool is provided. The exclusion ring includes an annular body, an outer peripheral edge, an inner peripheral edge, an upper surface and a lower surface. An open region is radially inward from the inner peripheral edge of the annular body. A flange extends from the lower surface of the annular body adjacent the outer peripheral edge of the annular body. The exclusion ring includes a first alignment structure on the flange, the first alignment structure including a guiding surface. The guiding surface slopes at an angle greater than 90° relative to the upper surface of the annular body.

In one embodiment, a chemical vapor deposition system is provided. The chemical vapor deposition system includes an exclusion ring that includes an annular body. The annular body of the exclusion ring includes an outer peripheral edge, an inner peripheral edge, an upper surface and a lower surface. An open central region extends radially inward from the inner peripheral edge of the annular body. A flange extends from the lower surface of the annular body adjacent the outer peripheral edge of the annular body. A first alignment structure is provided on the flange. The first alignment structure includes a guiding surface. The guiding surface slopes at an angle less than 90° relative to the lower surface of the annular body. The chemical vapor deposition system includes a platen including an upper surface and a lower surface. A second alignment structure is provided on the upper surface of the platen.

In one embodiment, a method of positioning an exclusion ring on a platen of a chemical vapor deposition tool is provided. The method includes positioning the exclusion ring over the platen. The exclusion ring includes an annular body including an outer peripheral edge, an upper surface and a lower surface. A flange extends from the lower surface of the annular body adjacent the outer peripheral edge of the annular body. The first alignment structure is on the flange. The first alignment structure includes a guiding surface which slopes at an angle greater than 90° relative to the upper surface of the annular body. The platen includes an upper surface and a second alignment structure on the upper surface of the platen. The method includes contacting the first alignment structure with the second alignment structure. Contact between the first alignment structure and the second alignment structure is maintained. While maintaining such contact between the first alignment structure and the second alignment structure, the first alignment structure is moved relative to the second alignment structure. The first alignment structure in the second alignment structure are moved relative to each other until the first alignment structure and the second alignment structure are aligned.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of positioning an exclusion ring on a platen of a chemical vapor deposition tool, the method comprising:
- positioning the exclusion ring over the platen, the exclusion ring including:
- an annular body including an outer peripheral edge, an upper side, a lower side opposite to the upper side, and a flange extending inward from the outer peripheral edge, the flange including a first surface at the lower side contacting a second surface of a lower portion of the platen, a third surface at the lower side contacting a fourth surface of an upper portion of the platen, the fourth surface of the upper portion of the platen is offset upward from the second surface of the lower portion of the platen, a fifth surface at the lower side extending over a part of a wafer positioned on the upper portion of the platen, a sixth surface at the upper side and facing away from the fifth surface, and a first alignment structure on the flange;
- an opening defined by the annular body; and
- a plurality of orifices that extend into the fifth surface and extend through the annular body to the sixth surface, and the plurality of orifices extend around the opening;
- the platen including a second alignment structure on the second surface of the lower portion of the platen;
- contacting the first alignment structure with the second alignment structure;
- maintaining contact between the first alignment structure and the second alignment structure;
- while maintaining contact between the first alignment structure and the second alignment structure, moving the first alignment structure relative to the second alignment structure; and
- aligning the first alignment structure with the second alignment structure.

2. The method of claim 1, wherein aligning the first alignment structure with the second alignment structure includes seating the second alignment structure within the first alignment structure.

3. The method of claim 1, wherein aligning the first alignment structure with the second alignment structure includes seating the first alignment structure within the second alignment structure.

4. The method of claim 1, wherein moving the first alignment structure relative to the second alignment structure includes sliding the second alignment structure along a guiding surface of the first alignment structure.

5. The method of claim 1, wherein one of the first alignment structure or the second alignment structure has a cross section in a plane parallel to a plane of the sixth surface at the upper side of the annular body, the cross section being rectangular.

6. The method of claim 1, wherein the first alignment structure has four guiding surfaces, each of the guiding surfaces sloping at an angle greater than 90 degrees relative to the sixth surface at the upper side of the annular body.

7. The method of claim 1, wherein the second alignment structure has a cross section in a plane parallel to a plane of the fourth surface of the upper portion of the platen, the cross section of the second alignment structure being rectangular.

8. The method of claim 1, wherein the first alignment structure has a dimension H and a guiding surface having a length L, the guiding surface and the second surface of the lower portion of the annular body defining an angle θ having an arc sine equal to H/L.

9. The method of claim 1, wherein one of the first alignment structure or the second alignment structure is ball shaped.

10. A method of positioning an exclusion ring on a platen of a chemical vapor deposition tool, the method comprising:
- positioning the exclusion ring over the platen, the exclusion ring including:
  - an annular body including an outer peripheral edge, an upper side, and a lower side opposite to the upper side, a flange extending inward from the outer peripheral edge, the flange including a first surface at the lower side contacting a second surface of a lower portion of the platen, a third surface at the lower side contacting a fourth surface of an upper portion of the platen, a fifth surface at the lower side extending over a part of a wafer positioned on the upper portion of the platen, a sixth surface at the upper side and facing away from the fifth surface, and a first alignment structure on the flange, the first alignment structure including a guiding surface, the guiding surface sloping at an angle greater than 90 degrees relative to the sixth surface at the upper side of the annular body;
  - an opening defined by the annular body; and
  - a plurality of orifices that extend into the fifth surface and extend through the annular body to the sixth surface, the plurality of orifices extending around the opening, each respective orifice of the plurality of orifices overlaps a gas groove that is adjacent to the upper portion of the platen and adjacent to the wafer, wherein the platen includes a second alignment structure on the second surface of the lower portion of the platen, and wherein the plurality of orifices are transverse to the gas groove;

contacting the first alignment structure with the second alignment structure;

maintaining contact between the first alignment structure and the second alignment structure;

while maintaining contact between the first alignment structure and the second alignment structure, moving the first alignment structure relative to the second alignment structure; and aligning the first alignment structure with the second alignment structure.

11. The method of claim 10, wherein aligning the first alignment structure with the second alignment structure includes seating the second alignment structure within the first alignment structure.

12. The method of claim 10, wherein moving the first alignment structure relative to the second alignment structure includes sliding the second alignment structure along a guiding surface of the first alignment structure.

13. The method of claim 10, wherein the first alignment structure has a cross section in a plane parallel to a plane of the sixth surface at the upper side of the annular body, the cross section of the first alignment structure being rectangular.

14. The method of claim 10, wherein the first alignment structure has four guiding surfaces, each of the guiding surfaces sloping at an angle greater than 90 degrees relative to the sixth surface at the upper side of the annular body.

15. The method of claim 10, wherein a cross section of the first alignment structure is square.

16. The method of claim 10, wherein the second alignment structure is ball shaped.

17. A method of positioning an exclusion ring on a platen of a chemical vapor deposition tool, the method comprising:

positioning the exclusion ring over the platen, the exclusion ring including:

an annular body including an outer peripheral edge an upper side, a lower side opposite to the upper side, a flange extending inward from the outer peripheral edge, the flange including a first surface at the lower side contacting a second surface of a lower portion of the platen, a third surface at the lower side contacting a fourth surface of an upper portion of the platen, a fifth surface at the lower side extending over a part of a wafer positioned on the upper portion of the platen, and a sixth surface at the upper side and facing away from the fifth surface, and a first alignment structure on the flange; and an opening defined by the annular body; and a plurality of orifices extend through the annular body from the fifth surface to the sixth surface at a portion of the annular body inset inward from the flange, each respective orifice of the plurality of orifices overlaps a gas groove that is adjacent to the upper portion of the platen and is adjacent to the wafer, and wherein the platen includes a second alignment structure on the second surface of the lower portion of the platen, wherein one of the first alignment structure or the second alignment structure has a sloped guiding surface;

contacting the first alignment structure with the second alignment structure;

maintaining contact between the first alignment structure and the second alignment structure;

while maintaining contact between the first alignment structure and the second alignment structure, moving the first alignment structure relative to the second alignment structure; and aligning the first alignment structure with the second alignment structure.

18. The method of claim 17, wherein aligning the first alignment structure with the second alignment structure includes seating the second alignment structure within the first alignment structure.

19. The method of claim 17, wherein aligning the first alignment structure with the second alignment structure includes seating the first alignment structure within the second alignment structure.

20. The method of claim 17, wherein moving the first alignment structure relative to the second alignment structure includes sliding the second alignment structure along a guiding surface of the first alignment structure.

* * * * *